United States Patent
Kang et al.

(10) Patent No.: US 11,812,552 B2
(45) Date of Patent: Nov. 7, 2023

(54) PRINTED CIRCUIT BOARD

(71) Applicant: SAMSUNG ELECTRO-MECHANICS CO., LTD., Suwon-si (KR)

(72) Inventors: Chul Mun Kang, Suwon-si (KR); Sang Jong Lee, Suwon-si (KR); Hyun Sang Kwak, Suwon-si (KR); Chi Hyeon Jeong, Suwon-si (KR); Seong Hwan Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 391 days.

(21) Appl. No.: 17/221,159

(22) Filed: Apr. 2, 2021

(65) Prior Publication Data

US 2022/0192014 A1    Jun. 16, 2022

(30) Foreign Application Priority Data

Dec. 10, 2020  (KR) ........................ 10-2020-0172645

(51) Int. Cl.
*H05K 1/02*    (2006.01)

(52) U.S. Cl.
CPC ........ *H05K 1/0298* (2013.01); *H05K 1/0218* (2013.01); *H05K 1/0219* (2013.01); *H05K 1/0222* (2013.01); *H05K 1/0227* (2013.01); *H05K 1/0221* (2013.01); *H05K 2201/0715* (2013.01)

(58) Field of Classification Search
CPC .. H05K 1/0222; H05K 1/0227; H05K 1/0219; H05K 1/0221; H05K 1/0218; H05K 2201/0707

See application file for complete search history.

(56) References Cited

U.S. PATENT DOCUMENTS

| | | |
|---|---|---|
| 4,776,087 A | 10/1988 | Cronin et al. |
| 10,651,525 B2 | 5/2020 | Elsherbini et al. |
| 2019/0230785 A1* | 7/2019 | Kim .................... H05K 1/0221 |
| 2023/0019563 A1* | 1/2023 | Nitta ...................... H05K 9/00 |

\* cited by examiner

*Primary Examiner* — Steven T Sawyer
(74) *Attorney, Agent, or Firm* — Morgan, Lewis & Bockius LLP (57) ABSTRACT

A printed circuit board, includes: a first insulating layer on which a wiring line is disposed; a second insulating layer covering an upper portion of the wiring line; a first conductive shield wall spaced apart from two opposing sides of the wiring line in a width direction of the wiring line, and extending in a length direction of the wiring line; and a second conductive shield wall spaced apart from two opposing ends of the first conductive shield wall in the length direction, and extending the a width direction. At least one of the first conductive shield wall or the second conductive shield wall includes a plurality of via walls each extending in a thickness direction of the first insulating layer and the second insulating layer and having a gap is disposed therebetween.

25 Claims, 7 Drawing Sheets

PRINTED CIRCUIT BOARD

CROSS-REFERENCE TO RELATED APPLICATION(S)

The present application claims the benefit of priority to Korean Patent Application No. 10-2020-0172645, filed on Dec. 10, 2020 in the Korean Intellectual Property Office, the disclosure of which is incorporated herein by reference in its entirety.

TECHNICAL FIELD

The present disclosure relates to a printed circuit board.

BACKGROUND

In recent years, as the thickness of electronic devices, such as foldable mobile phones and tablets, has been reduced, weight reduction, integration, and thickness reductions of electronic components are rapidly progressing, and the design of components has also diversified.

In the area of communications technology, evolution from 4G to 5G or millimeter wave (mmWave) high-frequency communications, or the like, is occurring, but coaxial cables used as transmission lines for communication signals are difficult to use because of their large volume, so a method of utilizing a printed circuit board is required.

When a communications signal is transmitted using a wiring line of a printed circuit board, a method for minimizing data loss is required.

In addition, there is a need for research that can be applied to mobile phones and tablets for bending and folding a printed circuit board to which a wiring line transmitting such a communications signal is applied. In order to implement an electronic device including a flexible display that requires hundreds of thousands of bends and folds, the flexible printed circuit board is required to be thin and durable. In a situation in which the thickness of the internal components constituting the flexible printed circuit board is reduced, a pattern crack defect occurs according to a pattern of a conductive line of the flexible printed circuit board, when repeated external force is continuously applied.

SUMMARY

An aspect of the present disclosure is to provide a printed circuit board having a structure for miniaturization and slimming, and minimizing data loss of a signal transmission line.

An aspect of the present disclosure is to provide a printed circuit board for minimizing high frequency data loss while maintaining bending or folding performance.

According to an aspect of the present disclosure, a printed circuit board includes: a first insulating layer on which a wiring line is disposed; a second insulating layer covering an upper portion of the wiring line; a first conductive shield wall spaced apart from two opposing sides of the wiring line in a width direction of the wiring line, and extending in a length direction of the wiring line; and a second conductive shield wall spaced apart from two opposing ends of the first conductive shield wall in the length direction, and extending in the width direction. At least one of the first conductive shield wall or the second conductive shield wall includes a plurality of via walls each extending in a thickness direction of the first insulating layer and the second insulating layer and having a gap between the plurality of via walls.

According to another aspect of the present disclosure, a printed circuit includes: a first insulating layer on which a coaxial transmission wiring line for transmitting a high frequency signal is disposed; a second insulating layer covering an upper portion of the coaxial transmission wiring line; a first conductive shield wall spaced apart from two opposing sides of the coaxial transmission wiring line in a width direction of the coaxial transmission wiring line, and extending in a length direction of the coaxial transmission wiring line; and a second conductive shield wall spaced apart from two opposing ends of the first conductive shield wall in the length direction, and extending in the width direction. At least one of the first conductive shield wall or the second conductive shield wall includes a plurality of via walls each extending in a thickness direction of the first insulating layer and the second insulating layer and having a gap between the plurality of via walls.

According to still another aspect of the present disclosure, a printed circuit board includes: a first insulating layer on which a wiring line is disposed; a second insulating layer covering an upper portion of the wiring line; and a conductive shield wall disposed around the wiring line and spaced apart from the wiring line. The conductive shield wall comprises a plurality of via walls each having a hexahedral shape, and a portion of at least one of the first insulating layer or the second insulating layer is disposed in a gap between an adjacent pair of the plurality of via walls.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, the present disclosure will be described with reference to the accompanying drawings.

The embodiments of the present disclosure may be changed in various forms, and are provided to more completely describe to those of ordinary skill in the art. Accordingly, the shape and dimensions of elements in the drawings may be exaggerated for clarity, and elements indicated by the same reference numerals in the drawings refer to the same elements.

In the present disclosure, the term "connected" may not only refer to "directly connected" but also include "indirectly connected" by means of an adhesive layer, or the like. The term "connected" may include both "electrically connected" in some cases.

In the present disclosure, the terms "first,""second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

The terms used herein describe particular embodiments only, and the present disclosure is not limited thereby. As used herein, the singular forms "a," "an," and "the" are intended to include the plural forms as well, unless the context clearly indicates otherwise.

Printed Circuit Board

Figure 1:
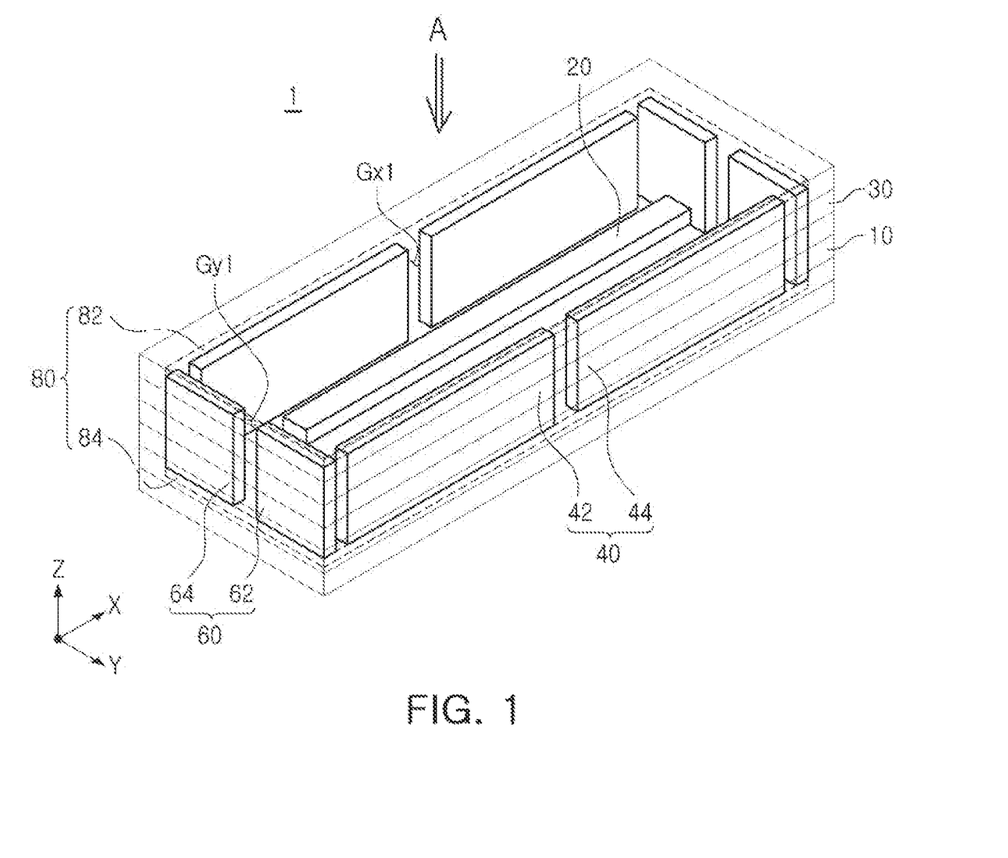
FIG. 1 is a schematic perspective diagram of a printed circuit board according to an example of the present disclosure.
Figure 2A:
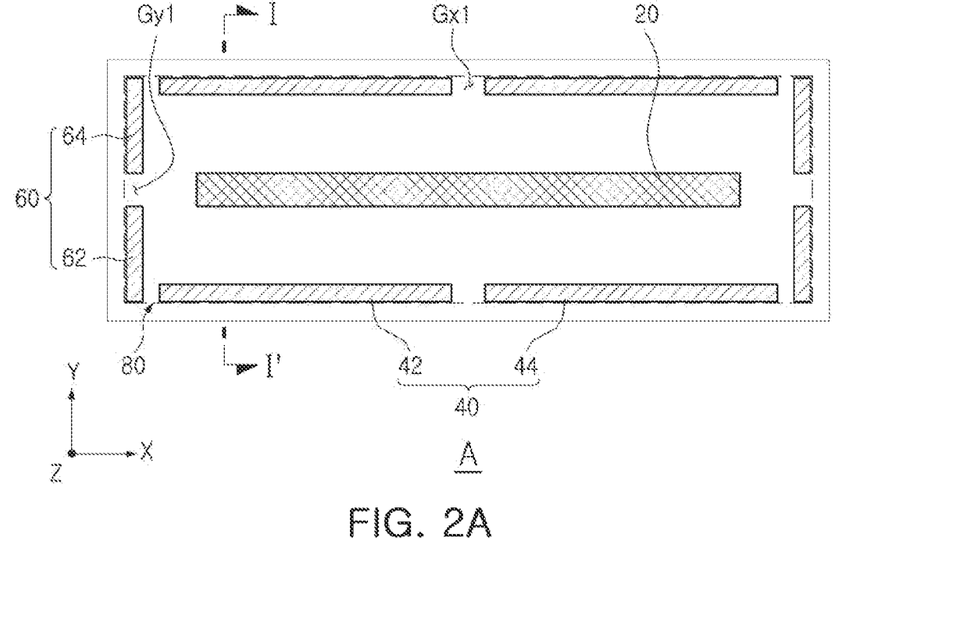
FIG. 2A is a schematic diagram of the printed circuit board of the first embodiment as viewed through A in FIG. 1.
Figure 2B:
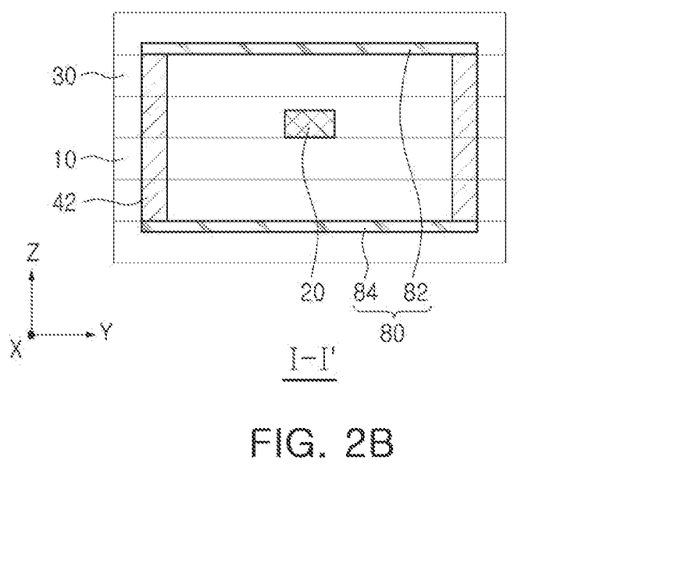
FIG. 2B is a schematic diagram illustrating a cross-section of portion I-I' of FIG. 2A.

FIG. 1 is a schematic perspective diagram of a printed circuit board according to an example of the present disclosure. FIG. 2A is a schematic diagram of the printed circuit board of the first embodiment as viewed through A in FIG. 1. FIG. 2B is a schematic diagram illustrating a cross-section of portion I-I' of FIG. 2A.

Referring to FIGS. 1 to 2B, a flexible printed circuit board 1 according to an example of the present disclosure includes a first insulating layer 10, a second insulating layer 30, a first conductive shield wall 40, and a second conductive shield wall 60.

First, if a direction is defined, X in the drawing is a length direction of the printed circuit board 1, Y is a width direction, and Z is a thickness direction.

A wiring line 20 may be disposed on the first insulating layer 10. The wiring line 20 may be a coaxial transmission wiring line for transmitting a high frequency signal.

The second insulating layer 30 may cover an upper portion of the wiring line 20, and may be a single layer or a plurality of layers. The first insulating layers 10 and 30 may include a thermosetting insulating resin or a photosensitive insulating resin, and may be formed of a glass-containing insulating material or a glass-free inorganic insulating resin.

Here, the printed circuit board 1 may be a multi-layered circuit board in which the first insulating layer 10 and the second insulating layer 30 are repeatedly built up, and the number of layers may be selected according to need.

The wiring line 20 may be a coaxial transmission wiring line for transmitting manufactured by plating or made of a copper foil. When a high frequency signal is transmitted to the wiring line 20, radiation may occur from the wiring line 20.

The first conductive shield wall 40 is spaced apart from two opposing sides of the wiring line 20 in the width direction Y, and extends in the length direction X of the wiring line 20. The second conductive shield wall 60 is spaced apart from two opposing ends of the first conductive shield wall 40 in the length direction X, and extends in the width direction Y of the wiring line 20.

The first conductive shield wall 40 and the second conductive shield wall 60 may prevent a signal from being radiated and leaking to the outside when a high-frequency signal is transmitted through the wiring line 20. The first conductive shield wall 40 may prevent radiation of the wiring line 20 in the width direction Y, and the second conductive shield wall 60 may prevent radiation of the wiring line 20 in the length direction X.

In this case, at least one of the first conductive shield wall 40 and the second conductive shield wall 60 includes via walls 42 and 62 connected in the thickness direction of the first insulating layer 10 and the second insulating layer 30. The first conductive shield wall 40 may have a plurality of via halls, and as shown in the drawing, a gap Gx1 may exist between the first via wall 42 and the second via wall 44 to control signal radiation of the wiring line 20. The gap Gx1 between the first via wall 42 and the second via wall 44 may implement bending in the case of a flexible printed circuit board.

The second conductive shield wall 60 also includes a first via wall 62 and a second via wall 64, and as shown in the drawing, a gap Gy1 may exist between the first via wall 62 and the second via wall 64 to control signal radiation of the wiring line 20.

Meanwhile, at least one of the first conductive shield wall 40 and the second conductive shield wall 60 may be connected to a ground wiring line 80 disposed below the first insulating layer 10 or above the second insulating layer 30. The ground wiring line 80 may be connected to an upper wiring line 82 disposed in an insulating layer above the second insulating layer 30 covering the wiring line 20 and a lower ground wiring line 84 disposed in an insulating layer below the first insulating layer 10 in the thickness direction Z in which a wiring line 20 is disposed. These can be manufactured by plating or made of a copper foil, and can prevent radiation leakage in the thickness direction of the wiring line 20.

Figure 3A:
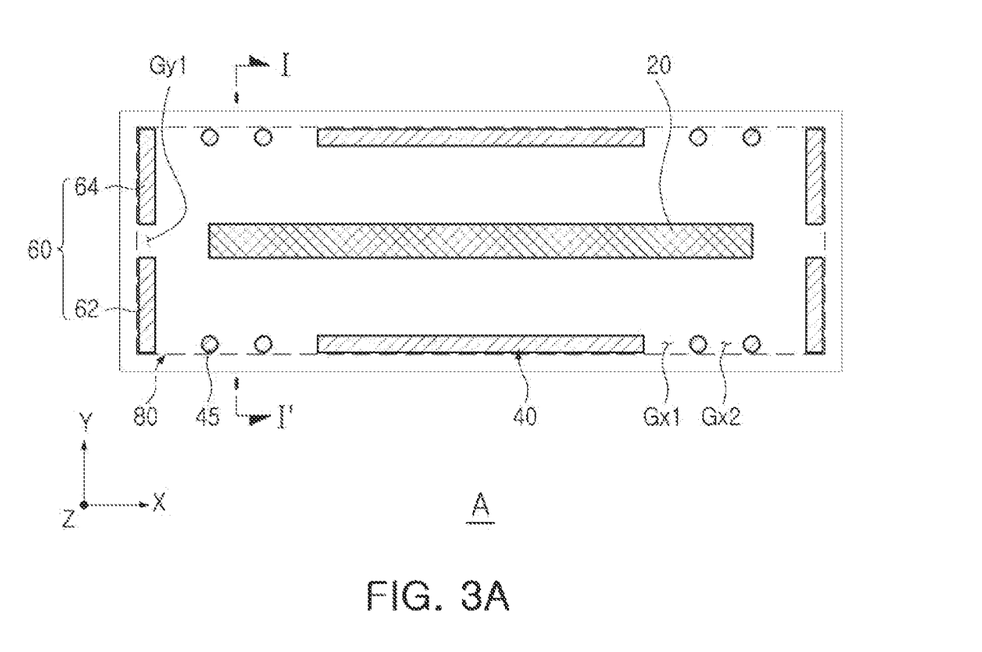
FIG. 3A is a schematic diagram of a printed circuit board of a second embodiment as viewed indirection A in FIG. 1.
Figure 3B:
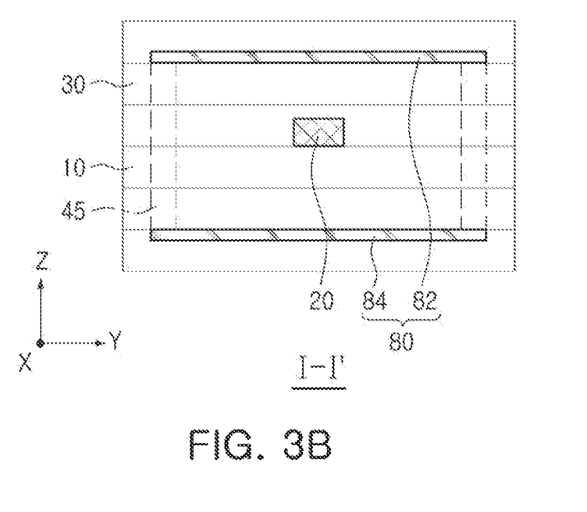
FIG. 3B is a schematic diagram illustrating a cross-section of portion I-I' of FIG. 3A.

FIG. 3A is a schematic diagram of a printed circuit board of a second embodiment as viewed through A of FIG. 1, and FIG. 3B is a schematic diagram illustrating a cross-section of portion I-I' of FIG. 3A.

Referring to FIGS. 3A and 3B, the printed circuit board of the second embodiment is mostly the same as the printed circuit board of the first embodiment, and thus only other parts will be described in detail.

The first conductive shield wall 40 is disposed in the length direction X near a middle portion of the wiring line 20 in the length direction X. In addition, the printed circuit board according to the present embodiment may include at least two or more vias 45 having circular cross-sections, spaced apart from the first conductive shield wall 40 with gaps Gx1 and Gx2.

The vias 45 having circular cross-sections, spaced apart from the first conductive shield wall 40 with the gaps Gx1 and Gx2 may control the radiation leakage in the width direction Y of the wiring line 20 and improve the bendability.

Figure 4:
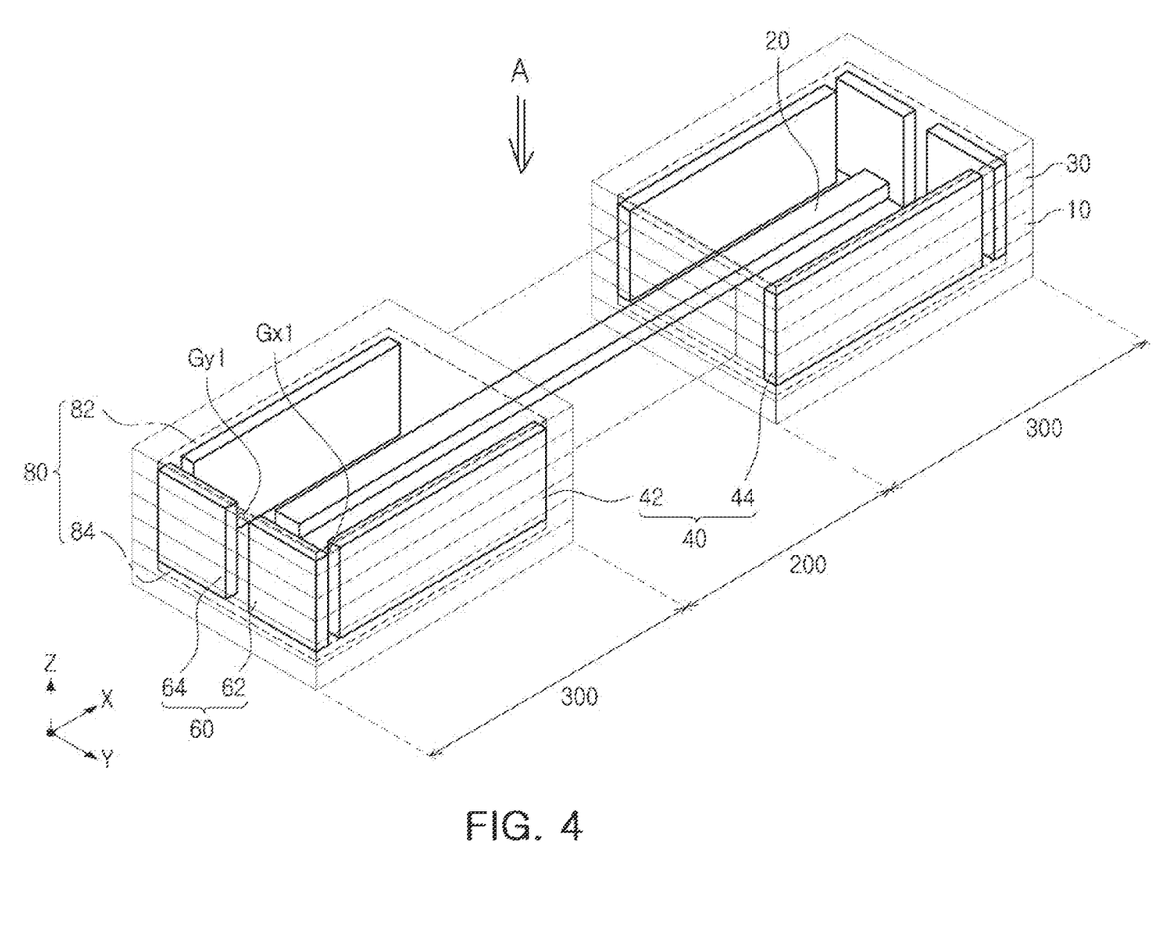
FIG. 4 is a schematic perspective diagram of a printed circuit board of a third embodiment according to another example of the present disclosure.
Figure 5A:
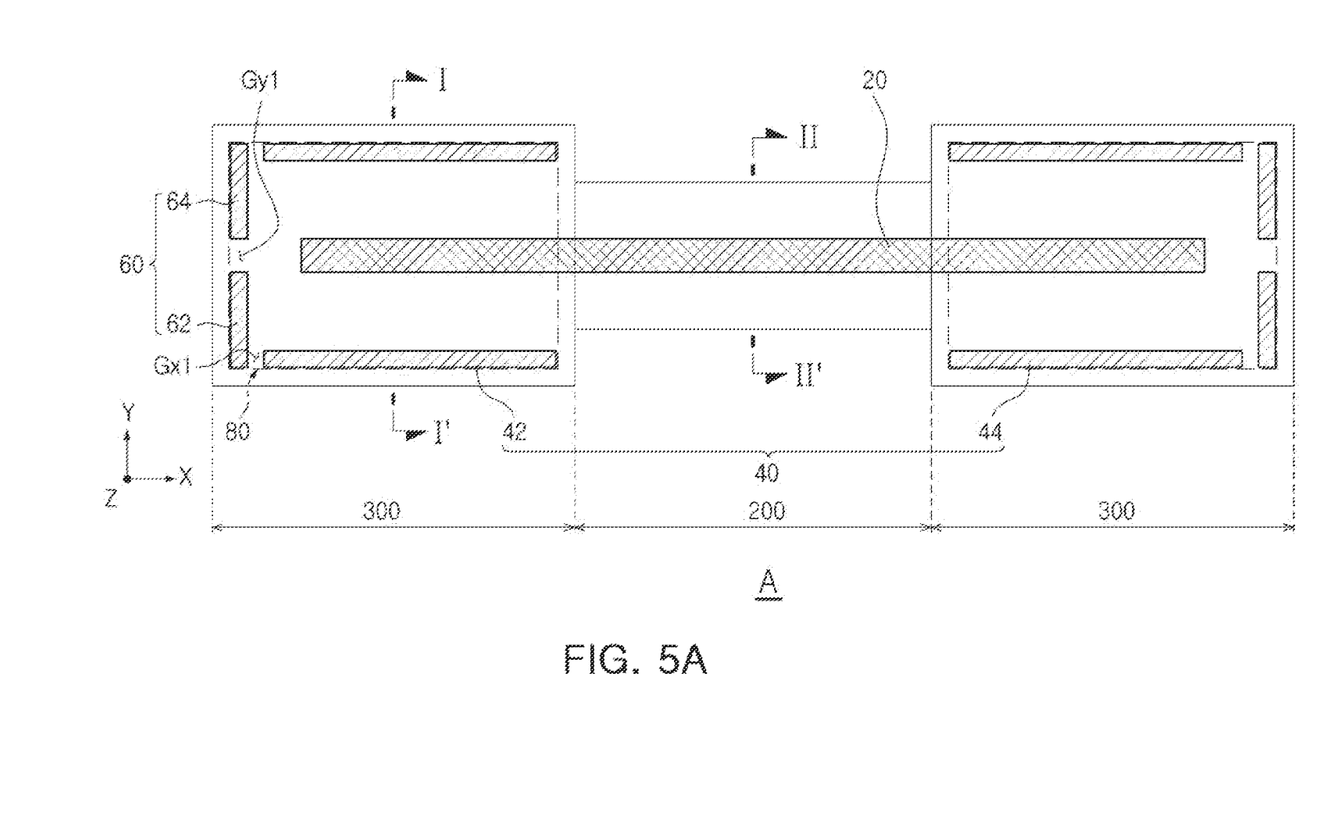
FIG. 5A is a schematic diagram of the printed circuit board viewed through A of FIG. 4.
Figure 5B:
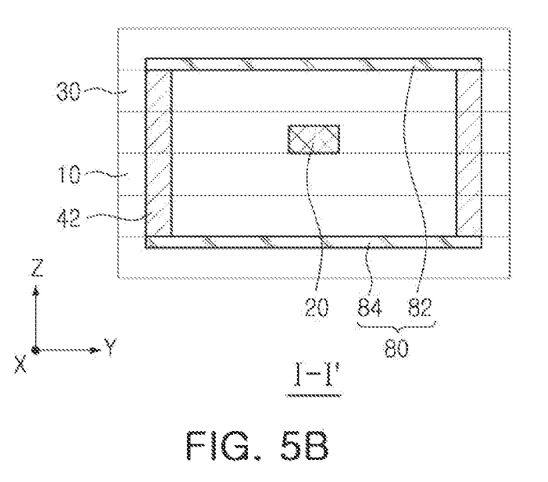
FIG. 5B is a schematic diagram illustrating a cross-section of portion I-I' of FIG. 5A.

FIG. 4 is a schematic perspective diagram of a printed circuit board of a third embodiment according to another example of the present disclosure, FIG. 5A is a schematic diagram of the printed circuit board viewed through A of FIG. 4, and FIG. 5B is a schematic diagram illustrating a cross-section of portion I-I' of FIG. 5A.

In the printed circuit board of a third embodiment, a rigid-flexible printed circuit board divided into a flexible region 200 and a rigid region 300 is illustrated.

The rigid region 300 describes a region that is more difficult to bend or fold than the flexible region 300, and it cannot be interpreted that the rigid is a region in which bending or folding cannot be performed.

In the rigid-flexible printed circuit board of the present embodiment, descriptions of the same elements as those of the printed circuit board of the first embodiment and the printed circuit board of the second embodiment described previously will be omitted.

A wiring line 20 is disposed in the flexible region 200 of the printed circuit board of the present embodiment. The wiring line 20 is disposed on the first insulating layer 10, and the first insulating layer 10 includes a polyimide (PI) resin having excellent heat resistance, and as long as it is a heat-resistant insulating coating resin such as polyethylene terephthalate (PET), a material thereof is not particularly limited. In addition, the first insulating layer 10 may use a liquid crystal polymer (LCP) to improve flexible properties such as bending or folding.

The wiring line 20 is formed of a copper foil on one surface of the first insulating layer 10 to be a wiring for transmitting an electrical signal. The wiring line 20 is a copper foil for signal transmission, and a rolled annealed Cu copper foil (RA) may be used to particularly reduce the thickness. However, if necessary, an electrodeposited (ED) copper (Cu) foil may be used, and a method for forming a copper foil is not particularly limited.

The rigid region 300 of the present embodiment may be a multi-layered circuit board of the above-described embodiment, and is disposed on both sides of the flexible region 200 in the length direction X.

The wiring line 20 of the flexible region 200 may also extend to the rigid region 300. In addition, as in the above-described embodiments, the first conductive shield wall 40 and the second conductive shield wall 60 are disposed in the rigid region 300.

The first conductive shield wall 40 may have a gap Gx1 with the second conductive shield wall 60 disposed in an outer portion of the rigid region 300 in the length direction X.

The via walls 62 and 64 of the second conductive shield wall 60 may have a gap Gy1 near a middle portion of the wiring line 20 in the width direction Y.

The first conductive shield wall 40 may prevent radiation of the wiring line 20 in the width direction Y, and the second conductive shield wall 60 may prevent radiation of the wiring line 20 in the length direction X.

Figure 5C:
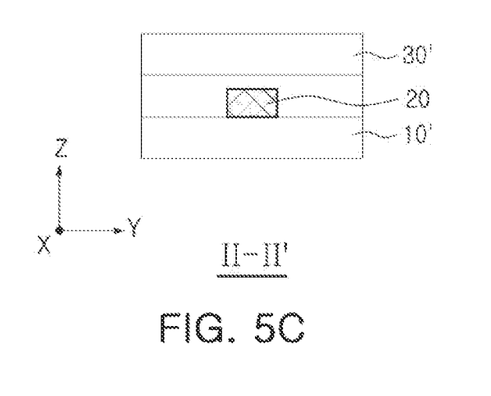
FIG. 5C is a schematic diagram illustrating a first embodiment of a cross-section of portion II-II' of FIG. 5A.
Figure 5D:
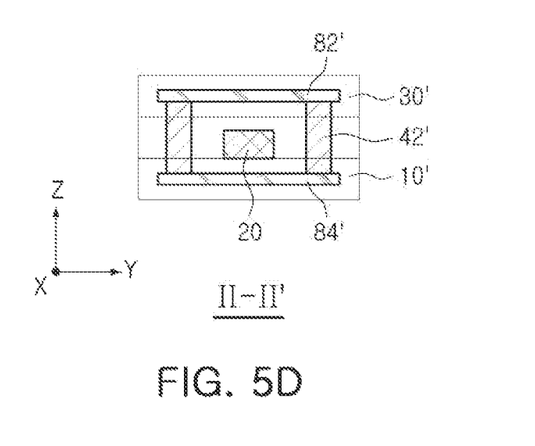
FIG. 5D is a schematic diagram illustrating a second embodiment of a cross-section of portion II-II' of FIG. 5A.

FIG. 5C is a schematic diagram illustrating a first embodiment of a cross-section taken along line II-II' of FIG. 5A, and FIG. 5D is a schematic diagram illustrating a second embodiment of a cross-section taken along line II-II' of FIG. 5A.

Referring to FIG. 5C, in order to maximize bendability or foldability of the flexible region 200, the first conductive shield wall 40 and the second conductive shield wall 60 are not included in the flexible region 200, and a ground wiring line is not disposed below the first insulating layer 10' or above the second insulating layer 30.

Meanwhile, referring to FIG. 5D, a first conductive shield wall 42' may be disposed near the wiring line 20 in the width direction Y, where the first conductive shield wall may be a via wall or a via.

Meanwhile, the first conductive shield wall 42' may be connected to ground wiring lines 82' and 84' disposed above or below the wiring line 20 of the flexible region 200.

The descriptions of the above-described embodiments may be applied to different embodiments within a range that does not contradict each other.

Referring to FIGS. 1 to 5D, the printed circuit board 1 includes a first insulating layer 10, a second insulating layer 30, a first conductive shield wall 40, and a second conductive shield wall 60.

A coaxial transmission wiring line 20 for transmitting a high frequency signal is disposed in the first insulating layer 10, and the second insulating layer 30 covers an upper portion of the coaxial transmission wiring line 20.

The first conductive shield wall 40 is spaced apart from two opposing sides of the coaxial transmission wiring line 20 in the width direction Y, and extends along the length direction X of the coaxial transmission wiring line 20. The second conductive shield wall 60 is spaced apart from two opposing sides of the first conductive shield wall 40 in the length direction X, and extends along the width direction Y of the coaxial transmission wiring line 20.

At least one of the first conductive shield wall 40 and the second conductive shield wall 60 may include via walls 42 and 62 connected in a thickness direction of the first insulating layer 10 and the second insulating layer 30, and a gap G may exist therebetween.

At least one of the first conductive shield wall 40 and the second conductive shield wall 60 may be connected to a ground wiring line 80 disposed below the first insulating layer 10 or above the second insulating layer 60.

The via walls 42 and 44 of the first conductive shield wall 40 may have a gap Gx1 near a middle portion of the coaxial transmission wiring line 20 in the length direction X.

The via walls 62 and 64 of the second conductive shield wall 60 may have a gap Gy1 near a middle portion of the coaxial transmission wiring line 20 in the width direction Y.

The first conductive shield wall 40 may extend in the length direction X near the middle portion of the coaxial transmission wiring line 20 in length direction X, and at least two or more vias 45 having circular cross-sections, spaced apart from the first conductive shield wall 40 while having, gaps Gx1 and Gx2 may be provided.

Meanwhile, the printed circuit board 1 may further include a flexible region 200 in which a coaxial transmission wiring line 20 is disposed; and a rigid region 300 disposed on both sides of the flexible region in a length direction and in which the coaxial transmission wiring line 20 of the flexible region 200 is extended.

The first conductive shield wall 40 and the second conductive shield wall 60 may be provided in the rigid region 300, and the first conductive shield wall 40 may have a gap Gx1 with the second conductive shield wall 60 disposed in an outer portion of the rigid region 300 in the length direction X.

At least one of the first conductive shield wall 40 and the second conductive shield wall 60 may be connected to a ground line 80 disposed below the first insulating layer 10 or above the second insulating layer 30 of the rigid region 300.

The via walls 62 and 64 of the second conductive shield wall 60 may also be provided with a gap Gy1 near a middle portion of the coaxial transmission wiring line 20 in the width direction Y.

The first conductive shield wall 42' may be provided in the flexible region 200, and the via wall 42' of the first conductive shield wall may be connected to a ground wiring line 80 disposed above or below the wiring line 20 of the flexible region 200.

As set forth above, according to the printed circuit board of the present disclosure, the printed circuit board may be reduced in size and slimmed overall, by applying a signal transmission line to the printed circuit board.

According to the printed circuit board of the present disclosure, data loss of a wiring line, serving as a transmission line of a high-frequency signal, while maintaining bending or folding performance may be minimized.

While exemplary embodiments have been shown and described above, it will be apparent to those skilled in the art that modifications and variations could be made without departing from the scope of the present invention as defined by the appended claims.

What is claimed is:

1. A printed circuit board, comprising:
a first insulating layer on which a wiring line is disposed;
a second insulating layer covering an upper portion of the wiring line;
a first conductive shield wall spaced apart from two opposing sides of the wiring line in a width direction of the wiring line, and extending in a length direction of the wiring line;
a second conductive shield wall spaced apart from two opposing ends of the first conductive shield wall in the length direction, and extending in the width direction;
a flexible region in which the wiring line is disposed; and
a rigid region disposed on two opposing sides of the flexible region in the length direction, wherein the wiring line of the flexible region extends in the rigid region,
wherein the first conductive shield wall and the second conductive shield wall are disposed in the rigid region, and
wherein at least one of the first conductive shield wall or the second conductive shield wall comprises a plurality of via walls each extending in a thickness direction of the first insulating layer and the second insulating layer and having a gap between the plurality of via walls.

2. The printed circuit board of claim 1, wherein at least one of the first conductive shield wall or the second conductive shield wall is connected to a ground wiring line disposed below the first insulating layer or above the second insulating layer.

3. The printed circuit board of claim 1, wherein the first conductive shield wall has a gap near a middle portion of the wiring line in the length direction.

4. The printed circuit board of claim 1, wherein the second conductive shield wall has a gap near a middle portion of the wiring line in the width direction.

5. The printed circuit board of claim 1, wherein the first conductive shield wall extends in the length direction near a middle portion of the wiring line in the length direction, and
at least two or more vias, having circular cross-sections, are disposed to be spaced apart from the first conductive shield wall by a gap.

6. The printed circuit board of claim 1,
wherein the first conductive shield wall has a gap with the second conductive shield wall disposed in an outer portion of the rigid region in the length direction.

7. The printed circuit board of claim 6, wherein at least one of the first conductive shield wall or the second conductive shield wall is connected to a ground wiring disposed below the first insulating layer or above the second insulating layer in the rigid region.

8. The printed circuit board of claim 7, wherein the via wall of the second conductive shield wall has a gap near a middle portion of the wiring line in the width direction.

9. The printed circuit board of claim 6, wherein a third conductive shield wall is disposed in the flexible region, and the third conductive shield wall is connected to a ground wiring disposed above or below the wiring line in the flexible region.

10. A printed circuit board, comprising:
a first insulating layer on which a coaxial transmission wiring line for transmitting a high frequency signal is disposed;
a second insulating layer covering an upper portion of the coaxial transmission wiring line;
a first conductive shield wall spaced apart from two opposing sides of the coaxial transmission wiring line in a width direction of the coaxial transmission wiring line, and extending in a length direction of the coaxial transmission wiring line;
a second conductive shield wall spaced apart two opposing ends of the first conductive shield wall in the length direction, and extending in the width direction;
a flexible region in which the coaxial transmission wiring circuit is disposed; and
a rigid region disposed on two opposing sides of the flexible region in the length direction, wherein the coaxial transmission wiring line of the flexible region extends in the rigid region,
wherein the first conductive shield wall and the second conductive shield wall are disposed in the rigid region, and
wherein at least one of the first conductive shield wall or the second conductive shield wall comprises a plurality of via walls each extending in a thickness direction of the first insulating layer and the second insulating layer and having a gap between the plurality of via walls.

11. The printed circuit board of claim 10, wherein at least one of the first conductive shield wall or the second conductive shield wall is connected to a ground wiring line disposed below the first insulating layer or above the second insulating layer.

12. The printed circuit board of claim 10, wherein the first conductive shield wall has a gap near a middle portion of the coaxial transmission wiring line in the length direction.

13. The printed circuit board of claim 10, wherein the second conductive shield wall has a gap near a middle portion of the coaxial transmission wiring line in the width direction.

14. The printed circuit board of claim 10, wherein the first conductive shield wall extends in the length direction near the middle portion of the coaxial transmission wiring line in the length direction,
wherein at least two or more vias, having circular cross-sections, are disposed to be spaced apart from the first conductive shield wall by a gap.

15. The printed circuit board of claim 10,
wherein the first conductive shield wall has a gap with the second conductive shield wall disposed in an outer portion of the rigid region in the length direction.

16. The printed circuit board of claim 15, wherein at least one of the first conductive shield wall or the second conductive shield wall is connected to a ground wiring line disposed below the first insulating layer or above the second insulating layer in the rigid region.

17. The printed circuit board of claim 16, wherein the via wall of the second conductive shield wall has a gap near a middle portion of the coaxial transmission wiring line in the width direction.

18. The printed circuit board of claim 15, wherein a third conductive shield wall is disposed in the flexible region, wherein the via wall of the third conductive shield wall is connected to a ground wiring line formed above or below the wiring line in the flexible region.

19. A printed circuit board, comprising:
a first insulating layer on which a wiring line is disposed;
a second insulating layer covering an upper portion of the wiring line;
a conductive shield wall disposed around the wiring line and spaced apart from the wiring line;
a flexible region in which the wiring line is disposed; and
a rigid region disposed on two opposing sides of the flexible region in a length direction of the wiring line, wherein the wiring line of the flexible region extends in the rigid region,
wherein the conductive shield wall comprises a plurality of via walls each being disposed in the rigid region and having a hexahedral shape, and
a portion of at least one of the first insulating layer or the second insulating layer is disposed in a gap between an adjacent pair of the plurality of via walls.

20. The printed circuit board of claim 19, wherein the conductive shield wall includes:
a first conductive shield wall spaced apart from two opposing sides of the wiring line in a width direction of the wiring line, and extending in a length direction of the wiring line; and
a second conductive shield wall spaced apart from two opposing ends of the first conductive shield wall in the length direction, and extending in the width direction, and
wherein the first conductive shield wall is spaced apart from the second conductive shield wall.

21. The printed circuit board of claim 20, wherein the first conductive shield wall includes a plurality of first via walls having a gap therebetween, and
wherein the second conductive shield wall includes a plurality of second via walls having a gap therebetween.

22. The printed circuit board of claim 21, wherein the gap between the first via walls is disposed near a middle portion of the wiring line in the length direction.

23. The printed circuit board of claim 21, wherein the gap between the second via walls is disposed near a middle portion of the wiring line in the width direction.

24. The printed circuit board of claim 20, wherein at least one via, having a circular cross-section, is disposed between the first and second conductive shield walls in the length direction.

25. The printed circuit board of claim 20, wherein at least one of the first conductive shield wall or the second conductive shield wall is connected to a ground wiring line disposed below the first insulating layer or above the second insulating layer.

* * * * *